(12) United States Patent
Miwa (10) Patent No.: US 6,285,575 B1
(45) Date of Patent: Sep. 4, 2001

(54) SHADOW RAM CELL AND NON-VOLATILE MEMORY DEVICE EMPLOYING FERROELECTRIC CAPACITOR AND CONTROL METHOD THEREFOR

(75) Inventor: Tohru Miwa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/542,230

(22) Filed: Apr. 4, 2000

(30) Foreign Application Priority Data

Apr. 7, 1999 (JP) .................................................. 11-099534

(51) Int. Cl.$^7$ ...................................................... G11C 11/22
(52) U.S. Cl. .......................... 365/145; 365/149; 365/154
(58) Field of Search .................................. 365/145, 149, 365/154, 117, 65

(56) References Cited

U.S. PATENT DOCUMENTS 4,809,225   2/1989  Dimmler et al. .
5,434,811 * 7/1995  Evans et al. ........................... 365/145
5,455,786 * 10/1995 Takeuchi et al. ...................... 365/145
5,751,627 * 5/1998  Ooishi ................................... 365/145

FOREIGN PATENT DOCUMENTS 4-57291   2/1992  (JP) .
2693967   9/1997  (JP) .

* cited by examiner

Primary Examiner—David Nelms
Assistant Examiner—David Lam
(74) Attorney, Agent, or Firm—Hutchins, Wheeler & Dittmer

(57) ABSTRACT

A shadow RAM cell and a non-volatile memory employing a ferroelectric capacitor, and a control method therefor can reduce number of transistors forming a memory cell to permit increasing of capacity comparable with SRAM. The a memory cell includes a flip-flop having a pair of storage nodes, a pair of switching elements controlled ON and OFF by a common word line and controlling connection between a pair of storage nodes and a pair of bit lines, and a pair of ferroelectric capacitors directly connected to the pair of storage nodes at respective one ends and connected to a plate line at the other end.

23 Claims, 10 Drawing Sheets

TIMING CHART IN RECALLING OPERATION OF THE PRESENT INVENTION

TIMING CHART IN STORING OPERATION OF PRIOR ART

FIG.11 PRIOR ART

TIMING CHART IN RECALLING OPERATION OF SECOND PRIOR ART

SHADOW RAM CELL AND NON-VOLATILE MEMORY DEVICE EMPLOYING FERROELECTRIC CAPACITOR AND CONTROL METHOD THEREFOR

BACKGROUND OF THE INVENTION

1. Field of the Invention The present invention relates generally to a shadow RAM (Random Access Memory) cell and a non-volatile memory device employing a ferroelectric capacitor and a control method therefor. More particularly, the invention relates to a shadow RAM having a memory cell fabricated by adding a ferroelectric capacitor to a SRAM (Static RAM) cell, performing reading and writing operation at high speed in the SRAM while power is supplied, and storing data in non-volatile manner by the ferroelectric capacitor while power is not supplied.

2. Description of the Related Art

Conventionally, there have been proposed a plurality of shadow RAMs, in which the ferroelectric capacitors and the SRAM cells are combined. These shadow RAM cells store information by the SRAMs while power is supplied, for permitting high speed reading and writing comparable with common SRAM. In addition, by transferring information stored in the SRAM cells in polarizing direction of the ferroelectric capacitor before shutting down of the power source, non-volatile storage is realized. Namely, the shadow RAM employing the ferroelectric capacitor is a storage device achieving non-volatile storage ability of the ferroelectric memory and high speed operation of the SRAM.

Figure 7:
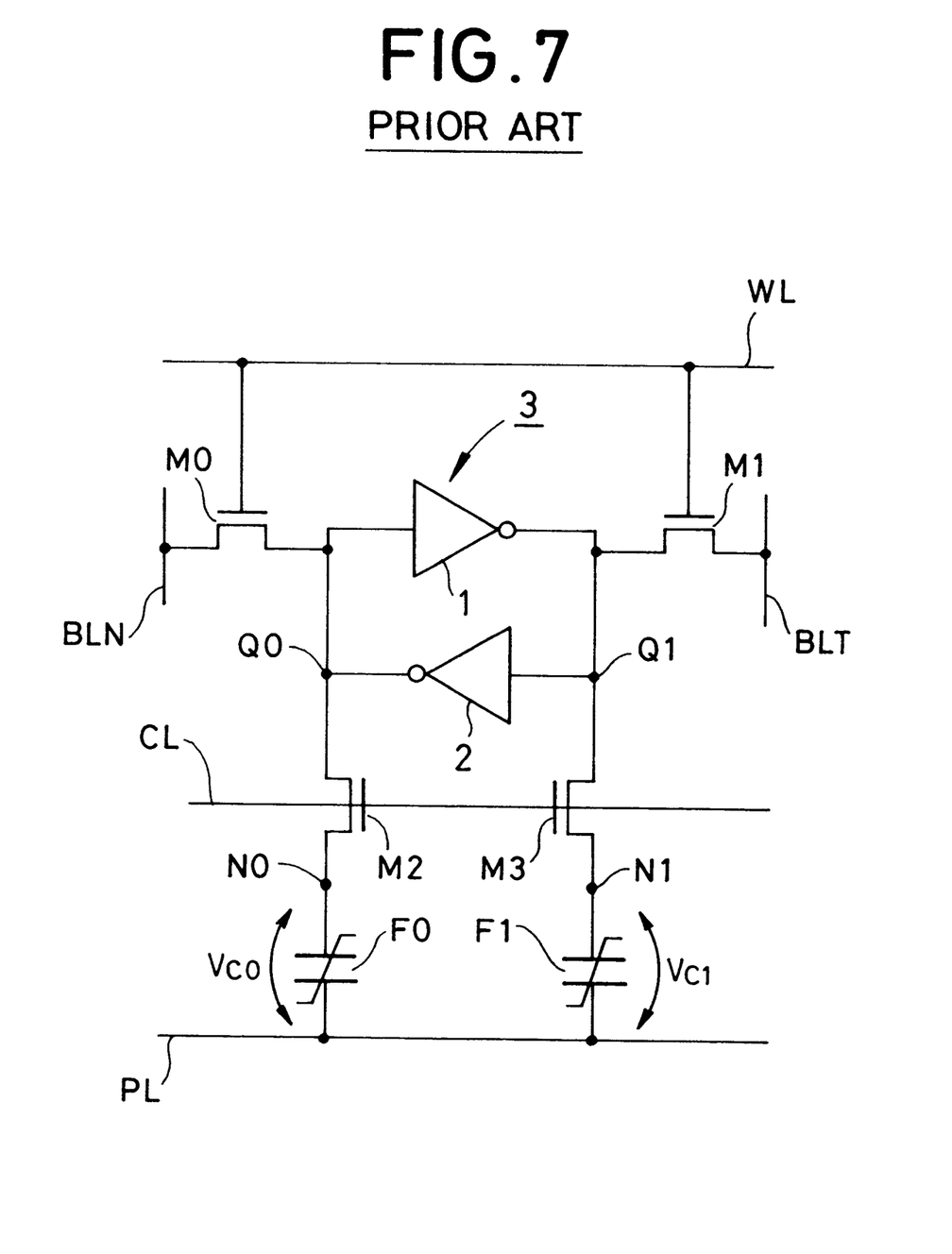
FIG. 7 is an illustration showing the conventional shadow RAM employing the ferroelectric capacitor.

For example, a construction of the memory cell of the shadow RAM employing the ferroelectric capacitor disclosed in Japanese Unexamined Patent Publication No. Heisei 4-57291 has a construction shown in FIG. 7. Two inverters (logical inverting elements) 1 and 2 form a flip-flop (F/F) 3 by mutually connecting input and output thereof. Tow storage nodes Q0 and Q1 of the flip-flop 3 are connected to a negative bit line BLN and a positive bit line BLT via NMOS transistors M0 and M1 serving as transfer gates respectively. These two positive and negative bit lines for a pair. To one end of a pair of positive and negative bit lines, a sense amplifier (not shown) comparing voltages thereof is connected.

Also, a writing circuit (not shown) selectively connecting either bit lines to a ground potential upon writing and a pre-charge circuit (not shown) for pre-charging the bit line to a power source potential or the ground potential are connected to the bit line. Gate electrodes of the NMOS transistors M0 and M1 are connected to a common word line WL. The word line WL is connected to a decoder circuit (not shown) for selectively driving one word line to be an object for access according to an address signal. Ferroelectric capacitors F0 and F1 connected to a common plate line PL at one end, are provided. The other ends N0 and N1 of the ferroelectric capacitors F0 and F1 are connected to the storage nodes Q0 and Q1 via NMOS transistors M2 and M3 serving as transfer gates.

Gate electrodes of the transistors M2 and M3 are connected to a common control line CL. The control line CL becomes HIGH level only during storing operation and recalling operation, in which the ferroelectric capacitors F0 and F1 are accessed, for connecting the flip-flop 3 and the ferrorelectric capacitors F0 and F1, respectively. In other states while power is supplied, the control line CL is held LOW level to electrically disconnect the flip-flop 3 and the ferroelectric capacitors. On the other hand, the plate line PL is maintained at LOW level while the control line CL is held at LOW level.

Next, operation of the conventional shadow RAM employing the ferroelectric capacitor will be discussed. It should be clear that writing and reading of information in and from the flip-flop 3 is similar to the conventionally typical SRAM. During idling while neither reading nor writing is performed, the bit line is pre-charged at HIGH level to lower potential at all word lines to disable the writing circuit and whereby to maintain information in the flip-flop 3.

For writing information in the flip-flop 3, an appropriate word line WL is risen by an address decoder. At the same time, the writing circuit is driven to make one of the bit lines BLT and BLN forming a pair into Low level according to data to write. When the word line WL i s risen, the MOS transistors M0 and M1 are turned ON. Since driving performance of the writing circuit is sufficiently larger than that of the inverters 1 and 2, the storage nodes connected to the bit lines drawn into LOW level by the writing circuit via the MOS transistor, is drawn into the ground potential. At the same time, the other storage node is pulled up to the power source voltage. Thus, the flip-flop 3 becomes stable.

On the other hand, reading of data from the flip-flop 3 is performed by selecting an appropriate word line and by amplifying a potential difference appearing on the selected bit line by the sense amplifier after pre-charging the bit line pair to HIGH level. By rising the word line WL, the MOS transistor connecting the storage node held at LOW level and the bit line, is turned ON to start lowering of the voltage of the relevant bit line. Since the MOS transistors of other bit lines are not turned ON, those bit lines are held HIGH level. By making judgment of potential difference of the bit lines forming a pair by the sense amplifier, information stored in the flip-flop can be read out.

Figure 8:
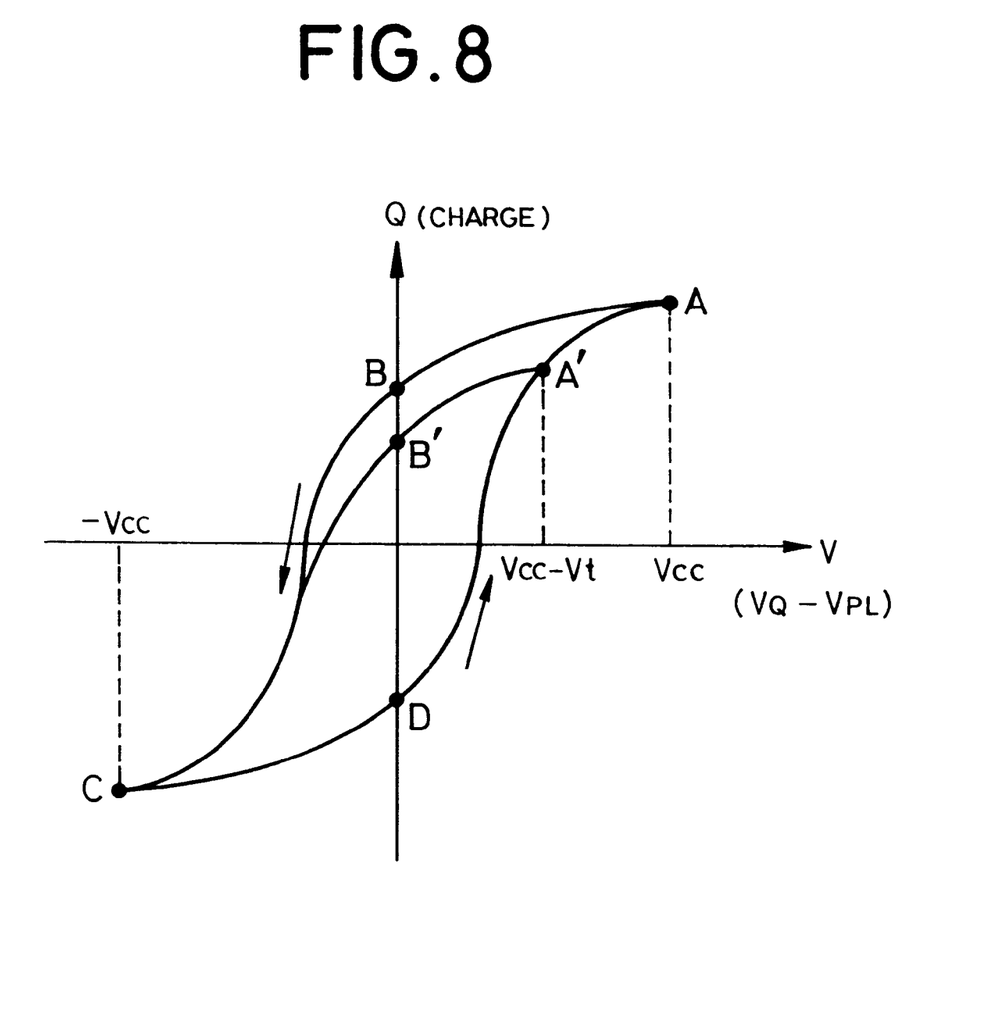
FIG. 8 is an illustration showing a hysteresis characteristics on a Q—V plane of the ferroelectric capacitor of the shadow RAM of FIG. 7.
Figure 9:
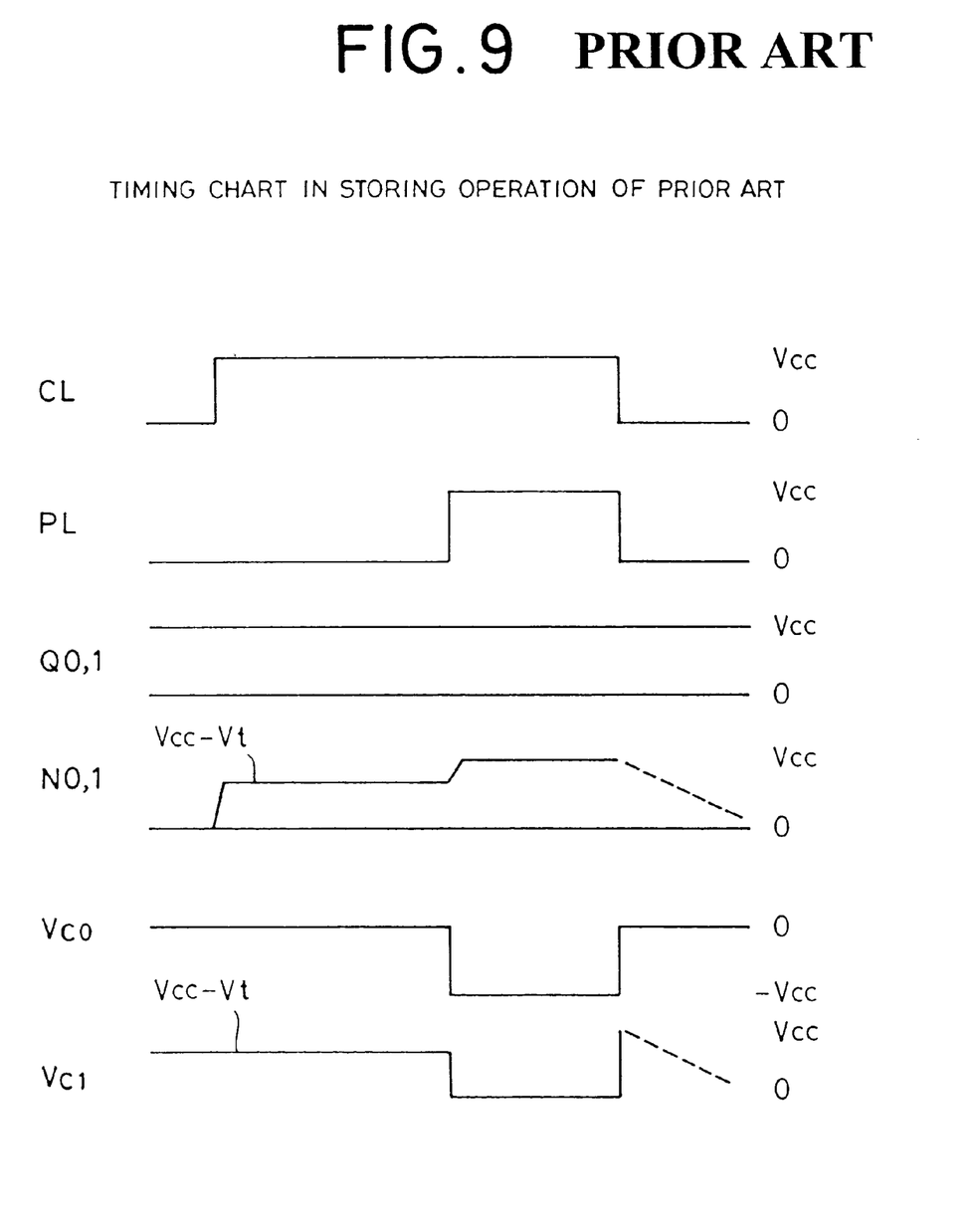
FIG. 9 is a timing chart in storing operation of the shadow RAM of FIG. 7.

Next, storing operation will be discussed with reference to FIGS. 8 and 9. FIG. 8 shows a hysteresis characteristics on a Q–V plane of ferroelectric capacitors F0 and F1, and FIG. 9 is a timing chart of waveforms of respective part in storing operation. Upon shutting down of the power source, data stored in the flip-flop is transferred to polarizing direction of the ferroelectric capacitors F0 and F1. This operation will be referred to as storing. Storing is activated in response to a store signal input in advance of lowering or shutting down of the power source. Storing is performed in the following procedure.

At first, the control line CL becomes HIGH level to electrically connect the flip-flop 3 and the ferroelectric capacitors F0 and F1. At this time, the plate line PL is held LOW level, 0V is applied to one of the ferroelectric capacitors connected to the storage node of 0V, and, on the other hand, a voltage of (Vcc−Vt) is applied on the side connected to the storage node of the power source voltage (Vcc). Here, Vt is a threshold voltage of the MOS transistors M2 and M3. When Vcc is applied to the control line CL, the voltage to be applied to the capacitor becomes (Vcc−Vt).

The voltages Vc0 and Vc1 respectively applied to the ferroelectric capacitors F0 and F1 are defined as potential differences between the potential on the terminal connected to the MOS transistors M2 and M3 and the potential of the terminal connected to the plate line PL. The voltage (Vcc−Vt) applied to the ferroelectric capacitor is shifted to a point A' of a hysteresis loop shown in FIG. 8.

Next, the plate line PL is risen to Vcc. At this time, the voltage applied to the ferroelectric capacitor to be applied the voltage (Vcc−Vt) at first becomes Vcc at both ends. This is because that since the transistors M2 and M3 are turned OFF to cause capacitive coupling by the ferroelectric capacitors to elevate the potential on the side of the transistor together with potential elevation of the plate line PL. Accordingly, the voltage to be applied to the ferroelectric capacitor becomes 0V to hold positive residual dielectric polarization (point B'). To the other ferroelectric capacitor, −Vcc is applied to shift to a point C of the hysteresis loop shown in FIG. 8.

Finally, the control line CL and the plate line PL are fallen down. Subsequently, the power source is shut down. After shutting down of the power source, respective nodes are converged to the ground potential. Accordingly, finally, the ferroelectric capacitor located at the point C is shifted to a point D to hold negative residual dielectric polarization. Since the ferroelectric capacitor may maintain the residual dielectric polarization for ten years or longer in the condition where no voltage is applied, the conventional shadow RAM employing the ferroelectric capacitor can store data in non-volatile manner.

Figure 10:
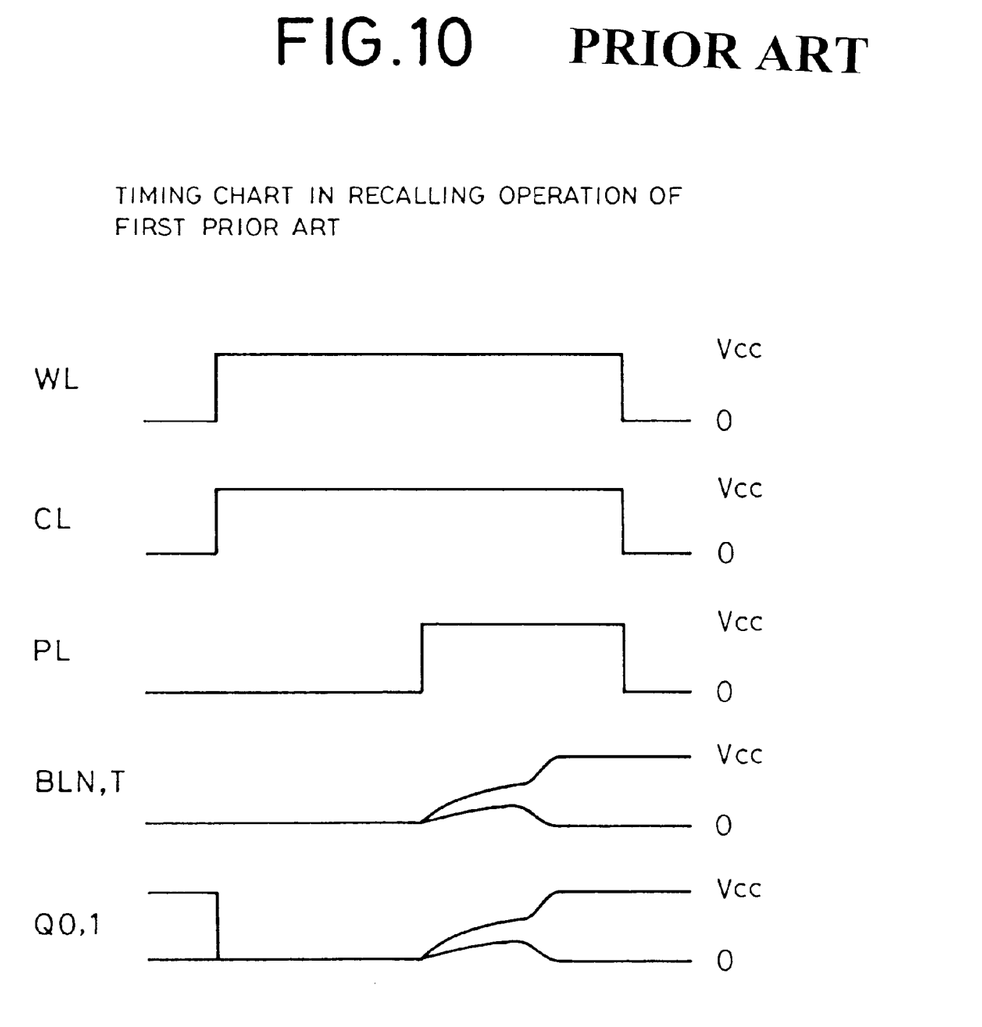
FIG. 10 is a timing chart showing one example of recalling operation of the shadow RAM of FIG. 7.

Next, recall operation will be discussed with reference to the timing chart of respective part shown in FIG. 10. Upon turning ON of power source, data held by the ferroelectric capacitor is transferred to the flip-flop 3. This operation is referred to recall operation. Upon turning ON of the power source, the control line CL is fixed at low level to maintain the residual dielectric polarization of the ferroelectric capacitor. After stabilization of the power source, recall operation is initiated. At first, after pre-charging the bit line to the ground potential, the word line WL and the control line CL are risen. Subsequently, the potential of the plate line PL is risen to apply a negative voltage to the ferroelectric capacitor. At this time, one of the ferroelectric capacitors located at the point B' in FIG. 8 discharges a charge associating with inversion of polarization. The other ferroelectric capacitor located at the point D does not cause inversion of polarization to discharge smaller amount of charge. As a result, among the storage nodes Q0 and Q1, the side connected to the ferroelectric capacitor causing inversion of polarization shows higher voltage than the other.

The potential difference appearing on the storage nodes Q0 and Q1 is amplified by the sense amplifier connected to the end of the bit line and re-written to the flip-flop 3 through the writing circuit. Finally, the control line CL, the word line WL and the plate line PL are fallen down and the pre-charge circuit is disabled to complete a sequence of operation. The sequence of operation is repeatedly performed for all of the word line in the memory cell array to perform recall for all memory cells.

Figure 11:
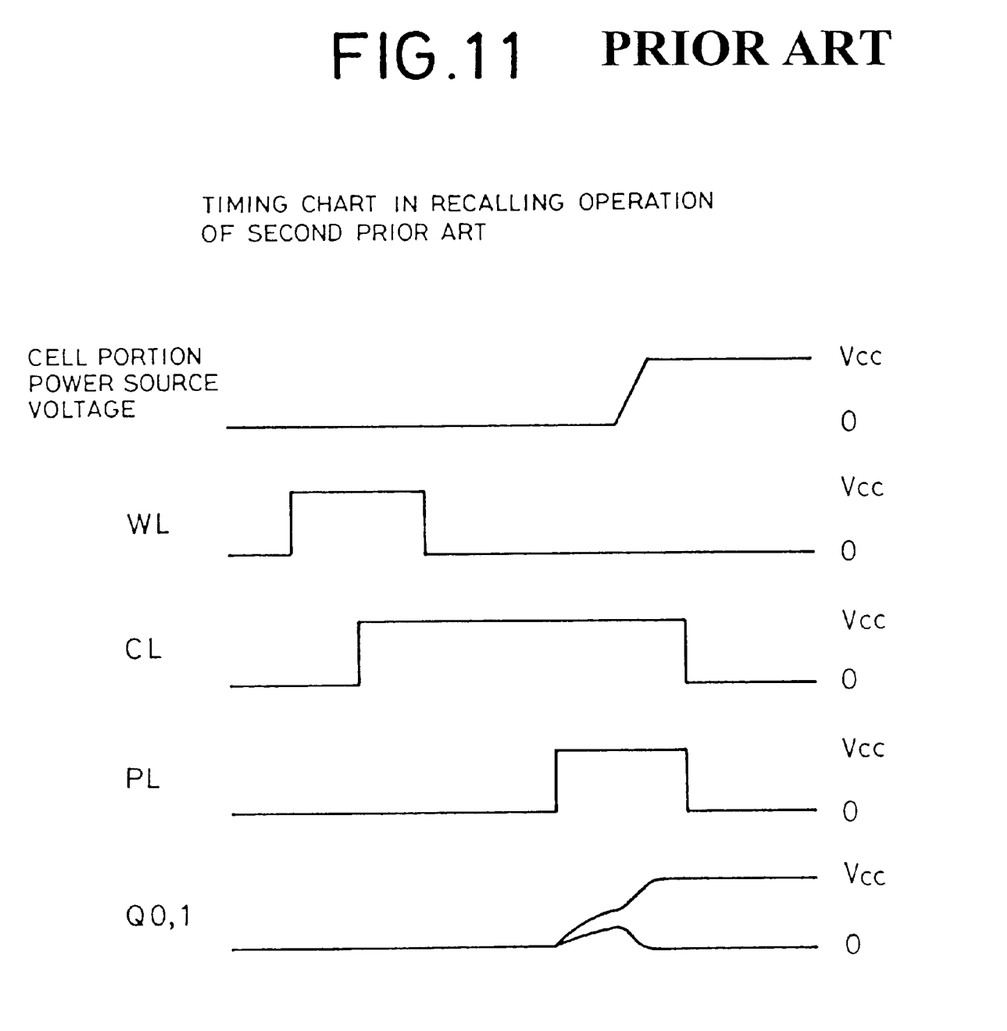
FIG. 11 is a timing chart showing another example of recalling operation of the shadow RAM of FIG. 7.

On the other hand, since Japanese Unexamined Patent Publication No. Heisei 1-66899 as the second prior art performs different recall operation from the first prior art whose construction is equal to that of FIG. 7, the recall operation will be discussed with reference to the timing chart of FIG. 11. In the second prior art, the power source potential of the flip-flop 3 is initially dropped to ground potential. Also, the word line WL is set at HIGH level to ground the storage node using the pre-charge circuit connected to the bit line. Then, the control line CL is set HIGH level to connect the ferroelectric capacitor to the flip-flop 3.

Then, by setting the word line WL low level, the bit line and the storage node are disconnected. Subsequently, the plate line PL is risen to HIGH level. Then, potential difference is caused in the storage nodes according to polarization direction of two ferroelectric capacitors. Thereafter, the power source potential of the flip-flop 3 is risen to the predetermined operation potential to amplify and maintain the potential difference of the storage nodes. Finally, the control line CL and the plate line PL are fallen down to be placed in idling condition.

As set forth above, in the shadow RAM employing the ferroelectric capacitors of the first and second prior art, stored data of the flip-flop 3 is maintained even through shutting down and turning ON of the power source. Therefore, the shadow RAM may serve as a non-volatile memory. Furthermore, reading and writing of data can be performed in the similar manner as normal SRAM since the flip-flop 3 and the MOS transistors M0 and M1 performs the similar function as the cell of the normal SRAM.

As the non-volatile memory employing the ferroelectric capacitor, there has been known constructions, in which the memory cell is formed with one transistor and one ferroelectric capacitor or with two transistors and two ferroelectric capacitors, as disclosed in Japanese Unexamined Patent Publication No. (Showa) 63-201998. Irrespective whether the power is supplied or not, information is stored depending upon direction of polarization of the ferroelectric capacitor. On the other hand, for destructive reading, writing can be performed subsequently to reading. Since number of times of access to the ferroelectric capacitor is quite large, reliability after use for long period cannot be always sufficient. On the other hand, in the shadow RAM employing the ferroelectric capacitor, access to the ferroelectric capacitor is performed only upon storing and recalling. Therefore, even with the ferroelectric capacitor having relatively low performance, sufficiently high reliability as product can be assured.

In the first and second conventional shadow RAMs employing the ferroelectric capacitors, the following two problems are encountered. The first problem is that number of transistors forming one memory cell is eight which is greater than normal SRAM cell (using six transistors), increasing of cell size is inherent to and thus is not suitable for achieving greater memory capacity.

The second problem is that the voltage lower than the power source voltage can be applied to the capacitor upon writing information to the ferroelectric capacitor upon shutting down of the power source. The reason is that the voltage applied to the ferroelectric capacity is restricted to (power source voltage—threshold voltage of M2 and M3). When the voltage to be applied to the ferroelectric capacitor upon storing becomes lower, the ferroelectric capacitor cannot be sufficiently polarized to cause possibility that the information cannot be restored upon turning the power source ON again. Particularly, under the trend of increasing package density of the CMOS process in the recent year, in which degree of lowering of the threshold voltage (Vt) becomes smaller than lowering of the power source voltage (Vcc), (Vcc−Vt) of the voltage in storing can cause more significant problem toward the future.

On the other hand, for applying the power source voltage without voltage drop, it becomes necessary to apply a voltage higher than the power source voltage in the extent corresponding to Vt, to the control line CL. In order to use high voltage, a circuit for generating high voltage is necessary. Secondly, it is also required to employ elements and circuits which can withstand the high voltage. Particularly, development of the transistor withstanding high voltage can be disinsentive for increasing package density of the advanced CMOS.

In addition to the foregoing two common problems, the first prior art encounters a problem in long operation period since the recall operation becomes repeated operation. Furthermore, relatively large control circuit is required for controlling the repeated operation. Namely, in the first prior art, the sense amplifier and the writing circuit are employed for recall operation. Therefore, bit number which can be recalled once is limited by number of the sense amplifiers and the writing circuits. Therefore, in recalling all memory cells, the recall operation for at least the number of word lines, is inherently repeated.

SUMMARY OF THE INVENTION

It is an object of the present invention to provide a shadow RAM cell and a non-volatile memory employing a ferroelectric capacitor, and a control method therefor, which can reduce number of transistors forming a memory cell to permit increasing of capacity comparable with SRAM.

Another object of the present invention is to provide a shadow RAM cell and a non-volatile memory employing a ferroelectric capacitor, and a control method therefor, which makes a voltage higher than a power source voltage unnecessary with maintaining high reliability and can enhance process affinity with a logic circuit not requiring a high voltage.

A further object of the present invention is to provide a shadow RAM cell and a non-volatile memory employing a ferroelectric capacitor, and a control method therefor, which permits recall operation for all memory cells at one time to enable shortening of operation period and simplification of a control circuit.

According to the first aspect of the present invention, a memory cell comprising:

a flip-flop having a pair of storage nodes;

a pair of switching elements controlled ON and OFF by a common word line and controlling connection between a pair of storage nodes and a pair of bit lines; and a pair of ferroelectric capacitors directly connected to the pair of storage nodes at respective one ends and connected to a plate line at the other end.

Then, the flip-flop may be formed with a pair of logic inverting elements, in which inputs and outputs are connected with each other in the pair of storage nodes. Each of the logic inverting elements is constructed with two transistors, each of the pair of switching elements may be formed with single transistor, and thus the memory cell is constructed with six transistors and the pair of ferroelectric capacitor elements. Each of the logic inverting elements may be constructed with one transistor, each of the pair of switching elements is formed with single transistor, and thus the memory cell is constructed with four transistors and the pair of ferroelectric capacitor elements.

The plate line may be switched between ground potential and power source potential with maintaining the pair of switching elements at OFF state during storing operation. Power source of the flip-flop is drawn up to a predetermined operation power source potential from ground potential with maintaining the pair of switching element OFF and maintaining the plate line at ground potential during recalling operation.

Also a potential of the plate line may be set at a predetermined potential between ground potential and power source potential while power is supplied except for the storing and recalling condition. The predetermined potential may be about half of the power source potential. The plate line is varied from the predetermined potential to the power source potential and then to the ground potential, or the connection potential to the ground potential to a power source voltage.

Also, a power supply other than storing operation and recalling operation, a potential difference (the predetermined potential—ground potential) and (the power source potential—the predetermined potential) applied at both ends of respective a pair of ferroelectric capacitor elements, is lower than a coercive voltage of the ferroelectric capacitor element.

According to the second aspect of the present invention, a non-volatile semiconductor memory device including memory cells arranged in a matrix at each intersection of the pair of bit line and the word line, the memory cells comprising: a flip-flop having a pair of storage nodes;

a pair of switching elements controlled ON and OFF by a common word line and controlling connection between a pair of storage nodes and a pair of bit lines; and a pair of ferroelectric capacitors directly connected to the pair of storage nodes at respective one ends and connected to a plate line at the other end.

Namely, all of the memory cells, the plate line may be connected in common. A non-volatile semiconductor memory device as set forth in claim 12, which further comprises a plate line driving circuit driving the plate line connected in common. The plate driving circuit may vary potential of the plate line connected in common from a predetermined potential between ground potential and power source potential, to the power source voltage and then to ground potential, or to ground potential and then to the power source voltage, sequentially, during storing operation. The plate driving circuit performs the storing operation at once for all memory cells connected to the plate line.

The plate driving circuit sets the potential of the place line commonly connected for setting a predetermined potential at a predetermined potential between the ground potential and the power source potential. In a power supply other than storing operation and recalling operation, the plate driving circuit may set a potential difference (the predetermined potential—ground potential) and (the power source potential—the predetermined potential) applied at both ends of respective a pair of ferroelectric capacitor elements, to be lower than a coercive voltage of the ferroelectric capacitor element.

According to the third aspect of the invention, a method for controlling a memory cell including a flip-flop having a pair of storage nodes, a pair of switching element controlled ON and OFF by a common word line and controlling connection between the pair of storage nodes and a pair of bit lines, and a pair of ferroelectric capacitor elements connected to the pair of storage nodes at respective one ends and to a plate line at the other end, comprising a step of:

upon storing operation, swinging the plate line between ground potential and power source position with maintaining the pair of switching element at OFF state. A power source of the flip-flop is pulled up from ground potential to a predetermined operational power source potential with maintaining the pair of switching element at OFF state and potential of the plate line at ground potential upon recalling operation. During power supplied state except for store operation and recall operation are take place, the potential of the plate line is set at a predetermined potential between ground potential and power source potential. The predetermined potential is about half of the power source voltage. Upon storing, the potential of the plate line is varied from the predetermined potential to the power source voltage and then to ground potential or to ground potential and then to power source voltage.

While the power is supplied state other than the storing operation and the recalling operation, a potential difference (the predetermined potential—ground potential) and (the power source potential—the predetermined potential) applied at both ends of respective a pair of ferroelectric capacitor elements, is lower than a coercive voltage of the ferroelectric capacitor alimenting to the first aspect of the present invention, a memory cell comprising:

a flip-flop having a pair of storage nodes;

a pair of switching elements controlled ON and OFF by a common word line and controlling connection between a pair of storage nodes and a pair of bit lines; and a pair of ferroelectric capacitors directly connected to the pair of storage nodes at respective one ends and connected to a plate line at the other end.

Then, the flip-flop may be formed with a pair of logic inverting elements, in which inputs and outputs are connected with each other in the pair of storage nodes. Each of the logic inverting elements is constructed with two transistors, each of the pair of switching elements may be formed with single transistor, and thus the memory cell is constructed with six transistors and the pair of ferroelectric capacitor elements. Each of the logic inverting elements may be constructed with one transistor, each of the pair of switching elements is formed with single transistor, and thus the memory cell is constructed with four transistors and the pair of ferroelectric capacitor elements.

The plate line may be switched between ground potential and power source potential with maintaining the pair of switching elements at OFF state during storing operation. Power source of the flip-flop is drawn up to a predetermined operation power source potential from ground potential with maintaining the pair of switching element OFF and maintaining the plate line at ground potential during recalling operation. Also a potential of the plate line may be set at a predetermined potential between ground potential and power source potential while power is supplied except for the storing and recalling condition. The predetermined potential may be about half of the power source potential. The plate line is varied from the predetermined potential to the power source potential and then to the ground potential, or the connection potential to the ground potential to a power source voltage.

Also, a power supply other than storing operation and recalling operation, a potential difference (the predetermined potential—ground potential) and (the power source potential—the predetermined potential) applied at both ends of respective a pair of ferroelectric capacitor elements, is lower than a coercive voltage of the ferroelectric capacitor element.

According to the second aspect of the present invention, a non-volatile semiconductor memory device including memory cells arranged in a matrix at each intersection of the pair of bit line and the word line, the memory cells comprising: a flip-flop having a pair of storage nodes;

a pair of switching elements controlled ON and OFF by a common word line and controlling connection between a pair of storage nodes and a pair of bit lines; and a pair of ferroelectric capacitors directly connected to the pair of storage nodes at respective one ends and connected to a plate line at the other end.

Namely, all of the memory cells, the plate line may be connected in common. A non-volatile semiconductor memory device as set forth in claim 12, which further comprises a plate line driving circuit driving the plate line connected in common. The plate driving circuit may vary potential of the plate line connected in common from a predetermined potential between ground potential and power source potential, to the power source voltage and then to ground potential, or to ground potential and then to the power source voltage, sequentially, during storing operation. The plate driving circuit performs the storing operation at once for all memory cells connected to the plate line.

The plate driving circuit sets the potential of the place line commonly connected for setting a predetermined potential at a predetermined potential between the ground potential and the power source potential. In a power supply other than storing operation and recalling operation, the plate driving circuit may set a potential difference (the predetermined potential—ground potential) and (the power source potential—the predetermined potential) applied at both ends of respective a pair of ferroelectric capacitor elements, to be lower than a coercive voltage of the ferroelectric capacitor element.

According to the third aspect of the invention, a method for controlling a memory cell including a flip-flop having a pair of storage nodes, a pair of switching element controlled ON and OFF by a common word line and controlling connection between the pair of storage nodes and a pair of bit lines, and a pair of ferroelectric capacitor elements connected to the pair of storage nodes at respective one ends and to a plate line at the other end, comprising a step of:

upon storing operation, swinging the plate line between ground potential and power source position with maintaining the pair of switching element at OFF state.

A power source of the flip-flop is pulled up from ground potential to a predetermined operational power source potential with maintaining the pair of switching element at OFF state and potential of the plate line at ground potential upon recalling operation. During power supplied state except for store operation and recall operation are take place, the potential of the plate line is set at a predetermined potential between ground potential and power source potential. The predetermined potential is about half of the power source voltage. Upon storing, the potential of the plate line is varied from the predetermined potential to the power source voltage and then to ground potential or to ground potential and then to power source voltage.

While the power is supplied state other than the storing operation and the recalling operation, a potential difference (the predetermined potential—ground potential) and (the power source potential—the predetermined potential) applied at both ends of respective a pair of ferroelectric capacitor elements, is lower than a coercive voltage of the ferroelectric capacitor element.

Action of the present invention will be discussed. In the shadow RAM, a construction is taken to directly connect the storage node of the flip-flop to the ferroelectric capacitor. Therefore, the shadow RAM cell according to the present invention can construct the memory cell with six transistors which is two less than the foregoing first and second conventional shadow RAM to realize large capacity comparable with the conventional six transistor SRAM.

In the shadow RAM according to the invention, while the power is supplied in the state other than storing and recalling state, reading and writing operation the same as the prior art is taken place. Upon storing, the place line is once pulled up to the power source voltage and subsequently pulled down to 0V. Then, an appropriate write pulse is applied to the ferroelectric capacitor. During recall operation, the plate line fixed at ground potential, only power source voltage is elevated to apply the ferroelectric capacitor for amplifying variation of the capacitor characteristics associating with difference of direction of the polarization by the flip-flops. Different from the first prior art, data can be restored without being assisted by the writing circuit. Therefore, the plate line can be common by the memory cells connected to a plurality of word lines.

On the other hand, in the shadow RAM according to the present invention, recall operation can be performed without the sense amplifier and the writing circuit. Therefore, for all of the memory cells can perform recalling at the same timing to shorten the period required for recalling operation and also permits simplification of the circuit.

Furthermore, in the shadow RAM according to the present invention, while power is supplied except for the state where storing or recalling operations are performed, the potential of the plate line is set at the intermediate value between the power source potential and ground potential. Such voltage is lowered to ½ of the power source voltage to avoid degradation of the capacitor.

As set forth above, the shadow RAM may be constructed by the shadow RAM in which the ferroelectric capacitor are directly connected to the internal node of the SRAM cell. Thus, in comparison with the conventional shadow, the area of the chip can be reduced. On the other hand, since recalling operation and storing operation can be performed without the sense amplifier and the writing circuit, all memory cells can be stored and recalled simultaneously. By this, a time required for storing and recalling operation in the overall shadow RAM can be shortened. At the same time, the control circuit performing control operation does not require control for short period, to permit the control circuit to be smaller than that in the first prior art.

On the other hand, upon writing information, the write pulse of the power source voltage can be applied to the ferroelectric capacitor without using the voltage higher than or negative power source voltage. Therefore, in comparison with the conventional shadow RAM applied the power source by using high voltage or negative voltage, the circuit scale can be reduced, the area of the chip can be eliminated, and furthermore, process affinity with the logic circuit or so forth not employing the high voltage and present in single chip can be improved.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structure are not shown in detail in order to avoid unnecessary obscurity of the present invention.

Figure 1:
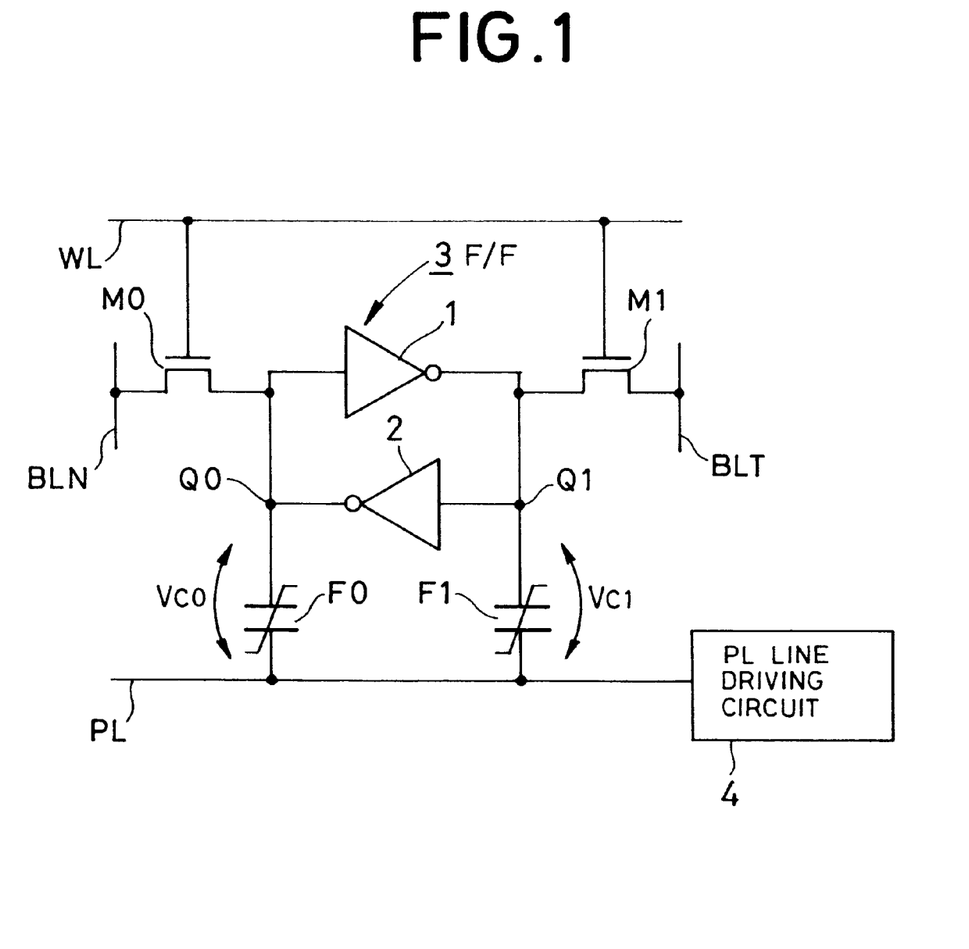
FIG. 1 is a circuit diagram showing an embodiment a shadow RAM cell and a non-volatile memory employing a ferroelectric capacitor according to the present invention.

FIG. 1 is an illustration showing an embodiment of a shadow RAM employing a ferroelectric capacitor according to the present invention. In the following discussion, like reference numerals to those of FIG. 7 identifies like components. Similarly to the conventional shadow RAM as shown in FIG. 7, the two inverters (logic inverting elements) 1 and 2 are mutually connected input and output for forming the flip-flop 3. The two storage nodes Q0 and Q1 of the flip-flop 3 are respectively connected to the negative bit line BLN and the positive bit line BLT via MOS transistors M0 and M1 respectively serving as transfer gates.

The positive and negative bit lines forms a pair. One ends of a pair of bit lines are connected to the sense amplifier (not shown) which compares voltages on the positive bit line and the negative bit line. Also, the writing circuit (not shown) which selectively connects one of the bit lines to the ground potential and the pre-charge circuit (not shown) for pre-charging the bit line to the power source voltage are connected to the bit lines. The gate electrode of the NMOS transistors M0 and M1 are connected to the common work line WL. The word line WL is connected to a decoder circuit (not shown) selectively driving one word line to be an object for access according to the address signal.

The ferroelectric capacitors F0 and F1 connected to the common plate line PL at one ends are directly connected to the storage nodes Q0 and Q1, respectively. The plate line PL is connected to a plate (PL) line driving circuit 4. Points different from the conventional SRAM in construction are that two ferroelectric capacitors F0 and F1 are added in the memory cell and the plate line PL connected to one end of the ferroelectric capacitor and the PL line driving circuit 4 for driving the former are added. Namely, comparing with the conventional shadow RAM shown in FIG. 7, the shadow RAM according to the present invention takes a construction, in which the MOS transistors M2 and M3 located between the storage nodes Q0 and Q1 and the ferroelectric capacitors F0 and F1 are omitted.

Next, discussion will be given for operation of the shown embodiment of the shadow RAM employing the ferroelectric capacitor according to the present invention. While the power is supplied and storing operation and recalling operation are not taken place, a voltage on the plate line is set at about half of the power source voltage (Vcc). Therefore, a voltage to be applied to the ferroelectric capacitor becomes about Vcc/2 or −Vcc/2. Data reading and writing operation to be performed while power is supplied is performed in the similar manner as the conventionally typical SRAM like the conventional shadow RAM. Therefore, operation in this state will be omitted from disclosure in order to keep the disclosure simple enough by avoiding redundant discussion, for facilitating clear understanding of the present invention.

Figure 2:
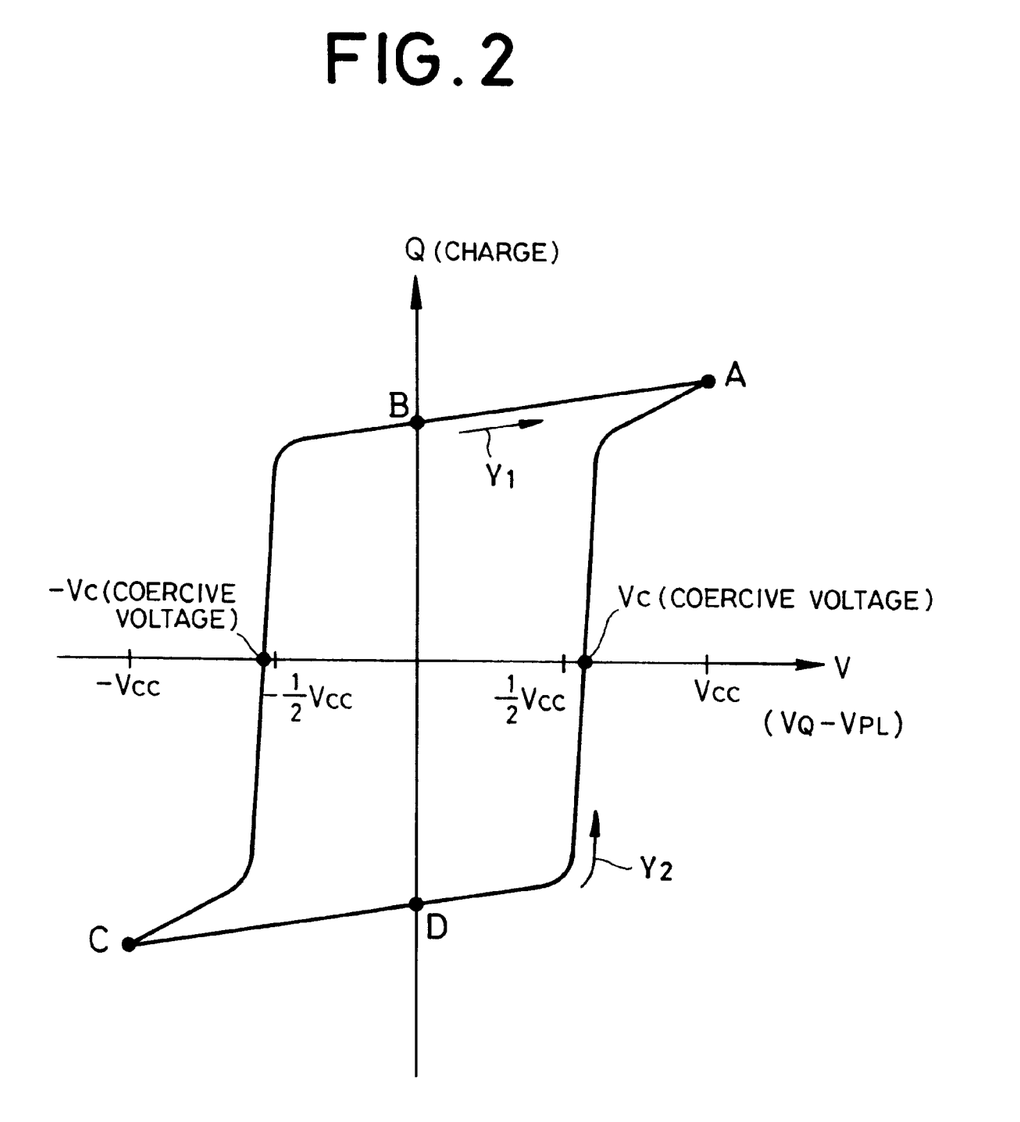
FIG. 2 is an illustration showing a hysteresis characteristics on a Q—V plane of the ferroelectric capacitor in the present invention.
Figure 3:
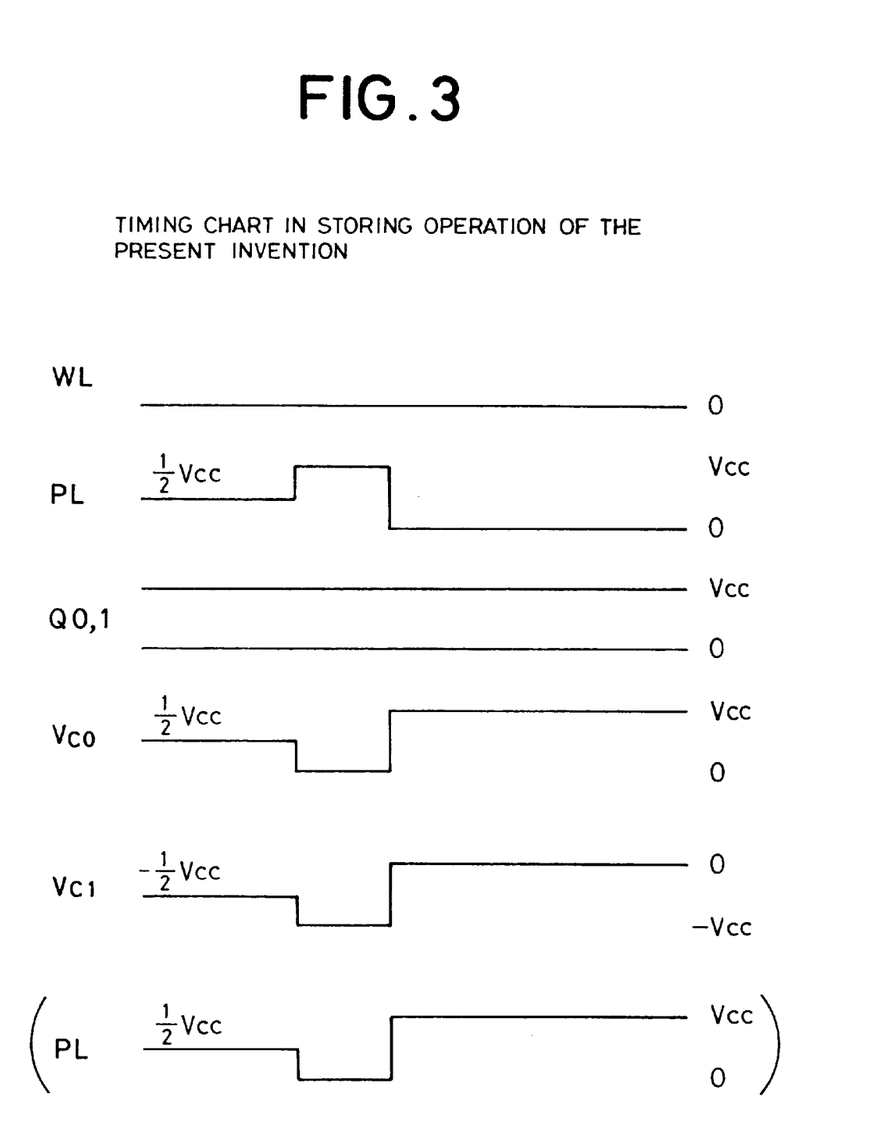
FIG. 3 is a timing chart in storing operation in the present invention.

Next, storing operation will be discussed with reference to FIGS. 2 and 3. FIG. 2 is an illustration showing a hysteresis characteristics on a Q—V plane of the ferroelectric capacitor in the present invention and FIG. 3 is a timing chart in storing operation in the present invention. Even in the shadow RAM of the present invention, similarly to the prior art, storing is performed by transferring the storage data of the flip-flop 3 in the direction of residual dielectric polarization of the ferroelectric capacitors F0 and F1. The storing operation is performed by driving the plate line PL from Vcc/2 to Vcc and then to 0V with maintaining the word line WL low level (it should be noted that as shown in the lowermost line of FIG. 3, it is also possible to drive the place line from Vcc/2 to 0V and then to Vcc).

By pulling up the plate line from Vcc/2 to Vcc, 0V is applied to the ferroelectric capacitor connected to the storage note holding the power source voltage and −Vcc is applied to the ferroelectric capacitor connected to the storage node holding the ground potential. The ferroelectric capacitor applied −Vcc is shifted to the point C of FIG. 2. Subsequently, when the plate line PL is pulled down to 0V, the ferroelectric capacitor connected to the storage node holding the power source voltage is applied Vcc and the ferroelectric capacitor connected to the storage node holding the ground potential is applied 0V. The ferroelectric capacitor applied Vcc is shifted to point A of FIG. 2.

Finally, when the power source is shut down and all nodes are discharged to the ground potential, the ferroelectric capacitor connected to the storage node holding the power source voltage holds the residual dielectric polarization Pr at the point B of FIG. 2 and on the other hand, the ferroelectric capacitor on the side of the storage node holding the ground potential holds the residual dielectric potential −Pr at the point D. Similarly to the prior art, since the ferroelectric capacitor holds the storage in a form of residual dielectric polarization while the power is not supplied, the shadow RAM may serve as the non-volatile memory.

Figure 4:
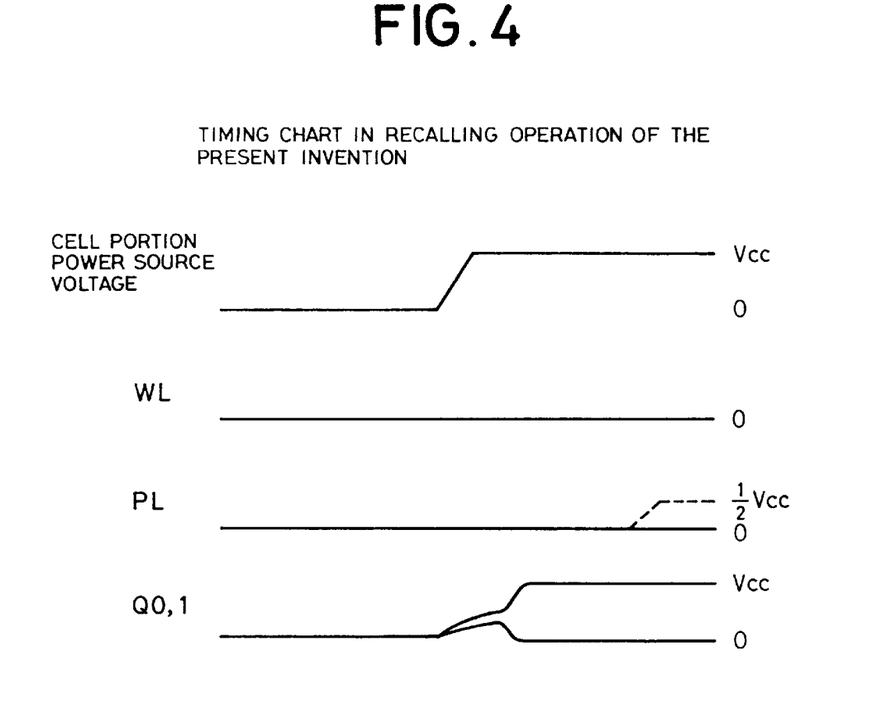
FIG. 4 is a timing chart in recalling operation in the present invention.

Next, recalling operation upon turning ON of power supply will be discussed with reference to the timing chart of FIG. 4. Upon turning ON of power supply, by only rising the power source of the flip-flop 3 with maintaining the word line WL and the plate line PL at LOW level, data stored in the ferroelectric capacitor in a form of residual dielectric polarization can be reproduced to the flip-flop 3. When the power source of the flip-flop 3 starts to rise, the potentials of the storage nodes are elevated by coupling of the MOS transistor forming the inverters 1 and 2. By this, the voltage to be applied to the ferroelectric capacitor is elevated from 0V to the positive side.

The ferroelectric capacitor holding the positive residual dielectric polarization at the point B of FIG. 2 serves as smaller capacity than the capacity for holding the negative residual dielectric polarization at the point D. This should be clear from the fact that the gradient of the trace formed on the Q—V plane is smaller in the range from B to A (arrow Y1) than that in the range from D to A (arrow Y2). Namely, the storage node connected to the former capacitor (smaller capacitor) is elevated more quickly than the other.

When the power source voltage is further elevated so that one of the storage nodes exceeds the threshold value of the transistors forming the inverters 1 and 2, positive feedback is applied to the flip-flop 3 to amplify high and low of the voltages of the storage nodes. Finally, the storage node held at the point B becomes Vcc, and the storage node held at the point D becomes the ground potential GND. Finally, the plate line is set at Vcc/2 to be placed in idling condition. As a result, the ferroelectric capacitor holding the Vcc before shutting down of the power source holds data at the point B, and holds Vcc after turning On of the power source. Similarly, the ferroelectric capacitor holding 0V before shutting down of the power source holds data at the point D and holds 0V after turning ON of the power source.

As set forth above, the ferroelectric capacitor of the present invention serves as the non-volatile memory holding the data stored in the flip-flop 3 across shutting down of the power source and turning ON the power source again. Furthermore, reading out and writing in of data can be performed in the similar manner as SRAM similarly to the conventional shadow RAM.

As set forth above, the shadow RAM of the present invention does not use the writing circuit and the sense amplifier upon recalling. Therefore, recalling operation can be performed in all of the memory cells At one time to achieve shortening of recall period and simplification of the control circuit. In the same reason, the shadow RAM according to the present invention can make the plate line as common wiring for all of the memory cells. Thus, number of plate line driving circuit can be reduced to contribute for reduction of the circuit area.

Figure 5:
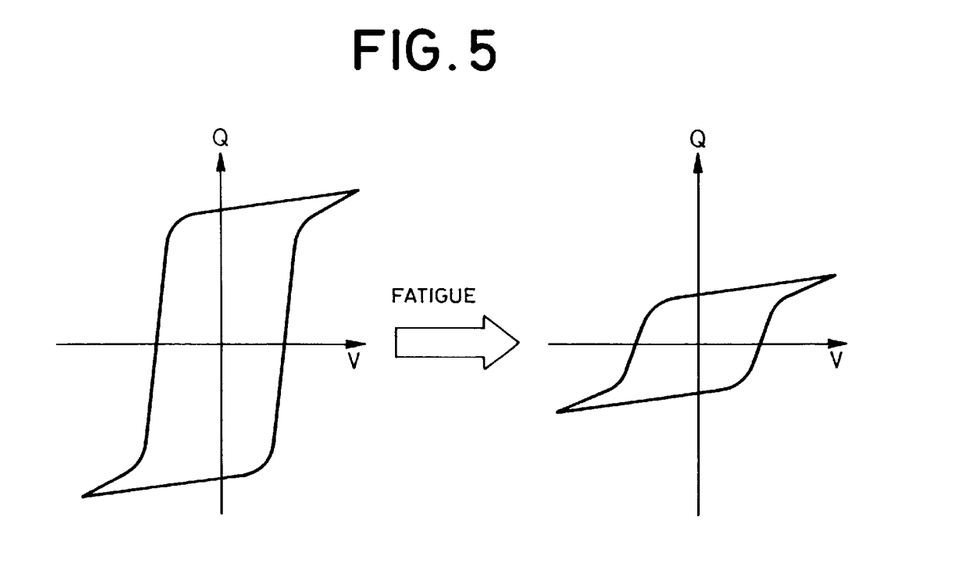
FIG. 5 is an illustration for explaining a fatigue deterioration associating with number of times of reversal of polarization of the ferroelectric capacitor.

The shadow RAM according to the present invention can lower the voltage to be applied to the ferroelectric capacitor to be about Vcc/2 by retting on the plate line PL at a predeterminal voltage (preferably Vcc/2) between Vcc and 0V in the normal state. By optimizing composition, layer thickness and structure of the ferroelectric capacitor, the voltage to be applied to the ferroelectric capacitor in the normal state can be lowered to be lower than a coercive voltage as the hysteresis characteristics of FIG. 2 in the present invention. Therefore, except for storing and recalling, polarization of the ferroelectric capacitors are normally held unchanged to avoid or reduce fatigue deterioration associating with number of times of reversal of polarization (FIG. 5 shows degradation condition of the hysteresis characteristics due to fatigue deterioration).

Figure 6A:
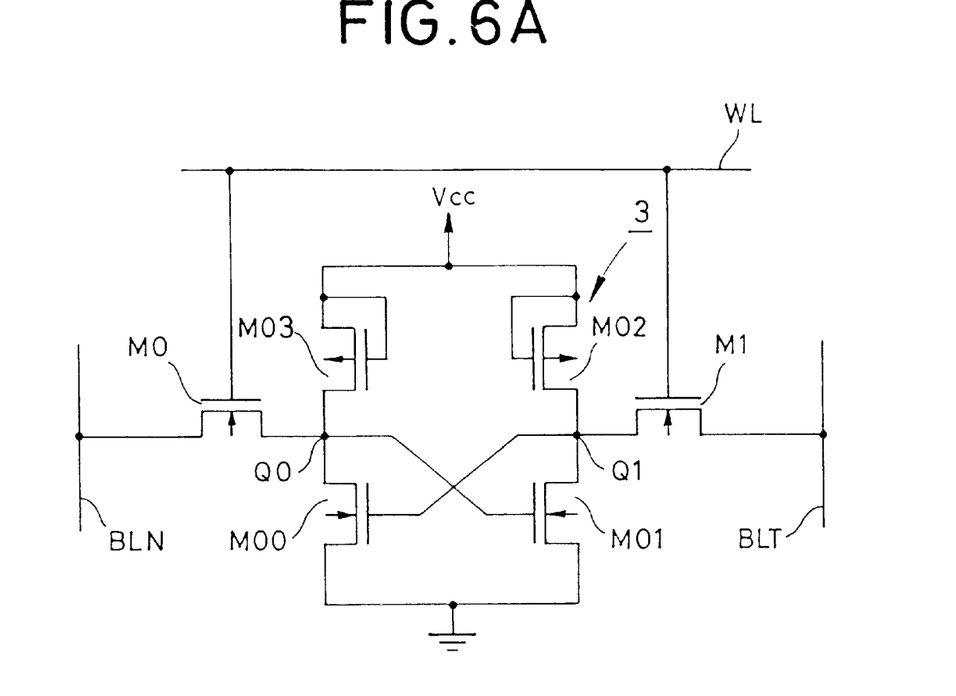
FIG. 6A is a circuit diagram showing one embodiment of a flip-flop forming a SRAM cell.
Figure 6B:
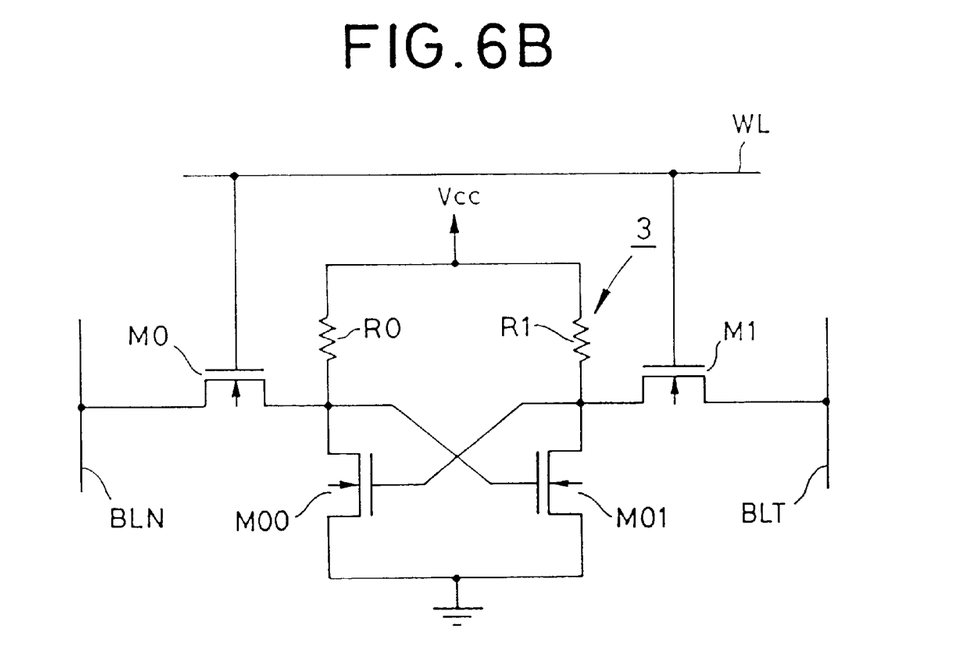
FIG. 6B is an illustration showing another embodiment of the flip-flop forming the SRAM cell.

It should be noted that the flip-flop 3 forming the SRAM shown in FIG. 1 is constructed with N-channel MOS transistors M00 and M01 and P-channel MOS transistors M02 and M03. CMOS inverter as shown in FIG. 6A and forming one cell together with the transfer gate MOS transistors M0 and M1 with six transistors. However, as shown in FIG. 6B, the present invention is also applicable for four transistor memory cell (memory cell having four transistors per cell), in which high and low resistors R0 and R1 are used as loads for the N-channel MOS transistors M00 and M01. On the other hand, the memory cell according to the present invention constructed as shown in FIG. 6B. On the other hand, the memory cell of the construction as illustrated in FIG. 1 can of course be used as a temporary memory.

As set forth above, according to the present invention, by eliminating the MOS transistor between the storage node and the ferroelectric capacitor, the memory cell can be constructed with six (or four) transistors, number of which is smaller than that of the conventional shadow RAM. Furthermore, since there is no voltage drop due to the MOS transistor, the power source voltage can be applied to the ferroelectric capacitor as is. Thus, reliability of holding of storage while power is not applied, can be enhanced. On the other hand, according to the present invention, since stalling and recalling operation can be performed for overall memory cells at one time to shorten operation period and simplification of the control circuit.

Since the electric field to be applied to the ferroelectric capacity can be lowered by setting the voltage on the plate line during normal power supply state at Vcc/2, in comparison with the conventional shadow RAM, in which no voltage is applied to the ferroelectric capacitor, lowering of capacity may be feared. However, as set forth above, if about Vcc/2 is smaller value than the coercive voltage which does not affect for polarization, degradation can be ignored.

Although the present invention has been illustrated and described with respect to exemplary embodiments thereof, it should be understood by those skilled in the art that the foregoing and various changes, emission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A memory cell comprising:
   a flip-flop having a pair of storage nodes;
   a pair of switching elements controlled ON and OFF by a common word line and controlling a connection between said pair of storage nodes and a pair of bit lines; and
   a pair of ferroelectric capacitors each directly connected to said pair of storage nodes at one respective end and connected to a plate line at the other end.

2. A memory cell as set forth in claim 1, wherein said flip-flop includes a pair of logic inverting elements with respective inputs and outputs connected with each other.

3. A memory cell as set forth in claim 2, wherein each of said logic inverting elements includes two transistors, each of said pair of switching elements includes a single transistor, and said memory cell includes six transistors and said pair of ferroelectric capacitor elements.

4. A memory cell comprising:
   a flip-flop having a pair of storage nodes;
   a pair of switching elements controlled ON and OFF by a common word line and controlling a connection between said pair of storage nodes and a pair of bit lines; and
   a pair of ferroelectric capacitors each directly connected to said pair of storage nodes at one respective end and connected to a plate line at the other end,
   wherein said flip-flop includes a pair of logic inverting elements with respective inputs and outputs connected with each other in said pair of storage nodes,
       wherein each of said logic inverting elements includes one transistor, each of said pair of switching elements includes a single transistor, and said memory cell includes four transistors and said pair of ferroelectric capacitor elements.

5. A memory cell comprising:
   a flip-flop having a pair of storage nodes;
   a pair of switching elements controlled ON and OFF by a common word line and controlling a connection between said pair of storage nodes and a pair of bit lines; and
   a pair of ferroelectric capacitors each directly connected to said pair of storage nodes at one respective end and connected to a plate line at the other end,
       wherein said plate line is switched between a ground potential and a power source potential while maintaining said pair of switching elements at an OFF state during a storing operation.

6. A memory cell comprising:
   a flip-flop having a pair of storage nodes;
   a pair of switching elements controlled ON and OFF by a common word line and controlling a connection between said pair of storage nodes and a pair of bit lines; and
   a pair of ferroelectric capacitors each directly connected to said pair of storage nodes at one respective end and connected to a plate line at the other end,
   wherein a power source of said flip-flop is drawn up to a predetermined operation power source potential from a ground potential while maintaining said pair of switching element OFF and maintaining said plate line at ground potential during a recalling operation.

7. A memory cell comprising:
   a flip-flop having a pair of storage nodes;
   a pair of switching elements controlled ON and OFF by a common word line and controlling a connection between said pair of storage nodes and a pair of bit lines; and
   a pair of ferroelectric capacitors each directly connected to said pair of storage nodes at one respective end and connected to a plate line at the other end,
       wherein a potential of said plate line is set at a predetermined potential between a ground potential and a power source potential while power is supplied except for a storing and a recalling condition.

8. A memory cell as set forth in claim 7, wherein said predetermined potential is set to a level about half of said power source potential.

9. A memory cell as set forth in claim 7, the potential of said plate line is varied from one of said predetermined potential to said power source potential and then to the ground potential,
   and the connection potential to said ground potential to the power source potential.

10. A memory cell as set forth in claim 7, wherein in a power supply potential, other than a potential for the storing operation and recalling operation, has a potential difference of one of (said predetermined potential minus said ground potential) and (said power source potential minus said predetermined potential) applied at both respective ends of a pair of ferroelectric capacitor elements, that is lower than a coercive voltage of the ferroelectric capacitor element.

11. A non-volatile semiconductor memory device including memory cells arranged in a matrix at each intersection of at least a pair of bit lines and at least a word line, said memory cells comprising:
   a flip-flop having a pair of storage nodes;
   a pair of switching elements controlled ON and OFF by a common word line and controlling a connection between said pair of storage nodes and a pair of bit lines; and a pair of ferroelectric capacitors each directly connected to said pair of storage nodes at one respective end and connected to a plate line at the other end.

12. A non-volatile semiconductor memory device as set forth in claim 11, wherein in all of said memory cells, said plate line is connected in common.

13. A non-volatile semiconductor memory device including memory cells arranged in a matrix at each intersection of said pair of bit line and said word line, said memory cells comprising:

a flip-flop having a pair of storage nodes;

a pair of switching elements controlled ON and OFF by a common word line and controlling a connection between said pair of storage nodes and a pair of bit lines; and a pair of ferroelectric capacitors each directly connected to said pair of storage nodes at one respective end and connected to a plate line at the other end, wherein in all of said memory cells, said plate line is connected in common, which further comprises a plate line driving circuit driving said plate line connected in common.

14. A non-volatile semiconductor memory device as set forth in claim 13, wherein said plate driving circuit varies a potential of said plate line connected in common from between a predetermined potential between a ground potential and a power source potential, to one of said power source potential and then to ground potential, and to said ground potential and then to said power source potential, sequentially, during a storing operation.

15. A non-volatile semiconductor memory device as set forth in claim 14, wherein said plate driving circuit performs said storing operation at once for all said memory cells connected in common to said plate line.

16. A non-volatile semiconductor memory device as set forth in claim 14, wherein said plate driving circuit sets the potential of said plate line at a predetermined potential level between the ground potential and the power source potential while power is supplied except for the storing operation and a recalling condition.

17. A non-volatile semiconductor memory device as set forth in claim 14, wherein in a power supply potential other than a potential for the storing operation and recalling operation, said plate driving circuit sets a potential difference of one of (said predetermined potential minus ground potential) and (said power source potential minus said predetermined potential) applied at both respective ends of a pair of ferroelectric capacitor elements, to be lower than a coercive voltage of the ferroelectric capacitor element.

18. A method for controlling a memory cell including a flip-flop having a pair of storage nodes, a pair of switching element controlled ON and OFF by a common word line and controlling a connection between said pair of storage nodes and a pair of bit lines, and a pair of ferroelectric capacitor elements connected to said pair of storage nodes at respective one ends and to a plate line at the other end, comprising a step of:

upon initiation of a storing operation, changing said plate line between a ground potential and a power source potential while maintaining said pair of switching element at an OFF state.

19. A control method for controlling a memory cell as set forth in claim 18, wherein a power source potential of said flip-flop is changed from the ground potential to a predetermined operational power source potential while maintaining said pair of switching element at the OFF state and the potential of said plate line at the ground potential upon a recalling operation.

20. A control method as set forth in claim 18, wherein during a power supplied state, except for when one of the storing operation and a recall operation are taking place, the potential of said plate line is set at a predetermined potential between the ground potential and the power source potential.

21. A control method as set forth in claim 20, wherein said predetermined potential is set to a level about half of the power source voltage.

22. A control method as set forth in claim 20, wherein, upon storing, the potential of said plate line is varied from said predetermined potential to one of said power source voltage and then to ground potential, and to ground potential and then to power source voltage.

23. A control method as set forth in claim 20, wherein while the power is supplied in a state other than said storing operation and said recalling operation, a potential difference of one of (said predetermined potential minus said ground potential), and (said power source potential minus said predetermined potential) that is applied at both respective ends of a pair of ferroelectric capacitor elements, is lower than a coercive voltage of the ferroelectric capacitor element.

* * * * *